United States Patent
Kagawa et al.

[11] Patent Number: 5,687,094
[45] Date of Patent: Nov. 11, 1997

[54] DESIGN VERIFICATION APPARATUS

[75] Inventors: Toshio Kagawa, Nara; Masaaki Yamane, Takatsuki, both of Japan

[73] Assignee: Matsushita Electric Industrial Co., Ltd., Osaka, Japan

[21] Appl. No.: 498,764

[22] Filed: Jul. 6, 1995

[30] Foreign Application Priority Data

Jul. 6, 1994 [JP] Japan .................................. 6-154080

[51] Int. Cl.$^6$ .................................................. G06F 17/50
[52] U.S. Cl. ................. 364/512; 364/468.03; 364/468.1; 364/468.12
[58] Field of Search ..................... 364/488, 512, 364/578, 468.03, 468.1, 468.12, 468.15, 468.16, 479.01

[56] References Cited

U.S. PATENT DOCUMENTS

| | | | |
|---|---|---|---|
| 4,870,591 | 9/1989 | Cicciarelli et al. | 364/468 |
| 5,191,534 | 3/1993 | Orr et al. | 364/468 |
| 5,550,746 | 8/1996 | Jacobs | 364/479.01 |
| 5,586,052 | 12/1996 | Iannuzzi et al. | 364/512 |

*Primary Examiner*—Vincent N. Trans
*Attorney, Agent, or Firm*—Greenblum & Bernstein P.L.C.

[57] ABSTRACT

A design verification apparatus for verifying the suitability of a design to the objectives of a design for an industrial product is disclosed. New design data specification is input. Old design data closest to the new design data is fetched from a design example database and is revised according to the new design specifications. Specification items and tolerance ranges for the specification items are generated based on the input specifications. Verification items based on the old design data and tolerance ranges for the verification items are fetched from a knowledge database. Verify values for the specification items and for the verification items are calculated. The verify values obtained according to the specification items are compared with the tolerance ranges for the specification items, and the verify values obtained according to the verification items are compared with the tolerance ranges for the verification items. The verify value is evaluated as to be good when the verify value is within the corresponding tolerance range.

10 Claims, 1 Drawing Sheet

Figure
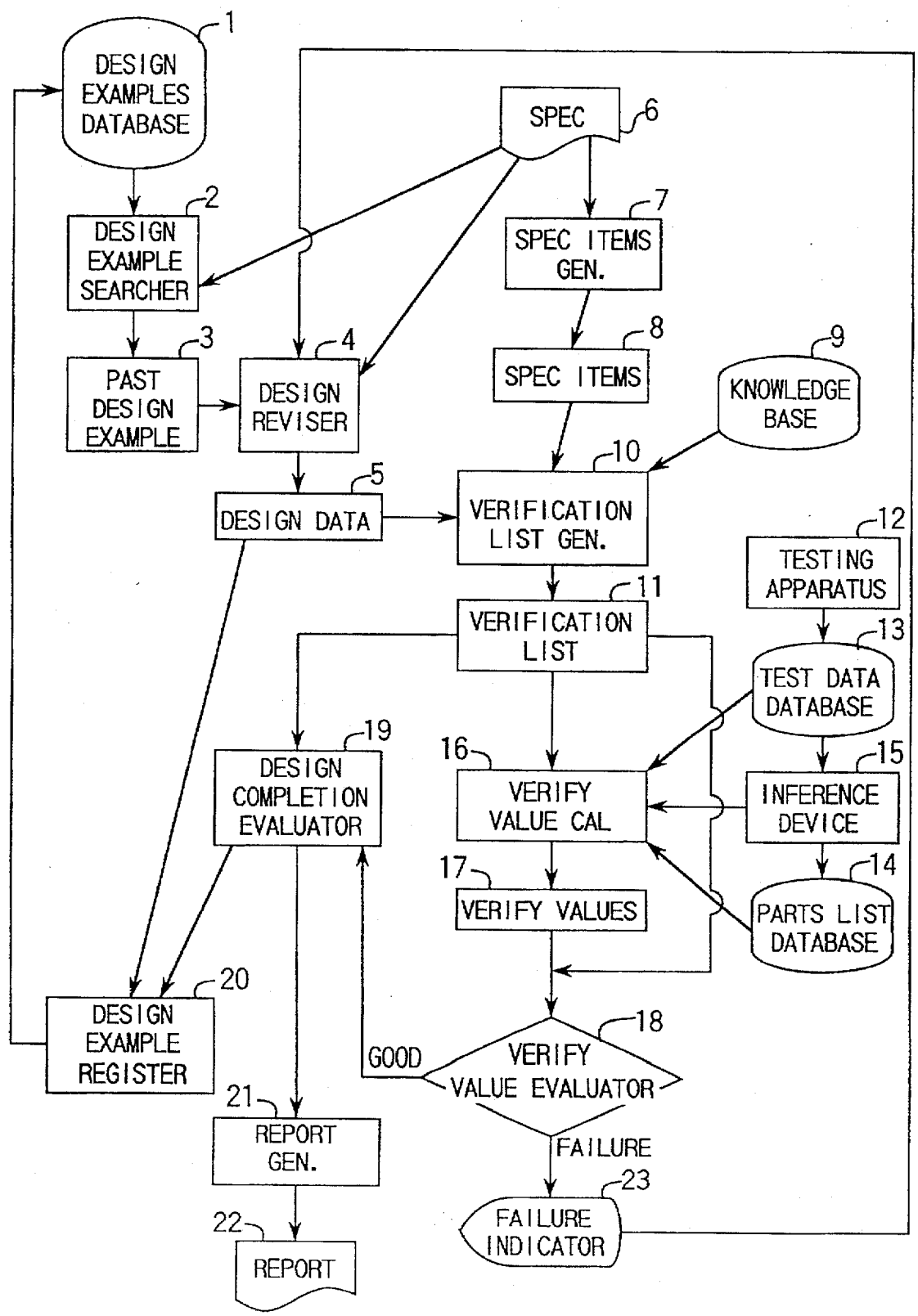

DESIGN VERIFICATION APPARATUS

BACKGROUND OF THE INVENTION

1. Field of the Invention

The present invention relates to an apparatus for verifying whether the design of a particular product will yield a product which when manufactured according to said design will satisfy the product specifications, and whether said design is therefore suited to the product.

2. Description of the Prior Art

In the process of designing industrial products, it is usual to review the design of the product to determine whether the design will yield a feasible finished product that will perform according to specifications. In most cases, this design verification process is completed manually by technicians with experience add training in the related field.

When CAD (computer-aided design) systems using computers and other information processing devices are used to develop a product design, it is also possible to conduct component shape interference tests whereby component parts are examined to check for contact between parts.

It is, however, virtually impossible with manual design verification processes for the technicians to detect all design defects, and verification omissions and errors result. When a prototype of the product is manufactured according to a design containing design defects undetected as a result of verification omissions, significant economic losses can accumulate from the need for a repeated prototyping process whereby newly detected design defects are laboriously resolved.

Another problem with this manual design verification process is that verification depends greatly upon the prior experience of the technician verifying the design, and there is no easy means of sharing the accumulated experience of one technician with the other technicians. As a result, similar verification omissions often occur, and the occurrence of verification errors is high. Furthermore, different verification technicians may examine the same design by checking for different verification content, thereby introducing further variation to the verification process.

Design verification by means of CAD systems, on the other hand, tends to simply verify component dimensions and sizes because it is difficult to verify a design with consideration given to the effect of temperature, weight, and other physical properties. It is also difficult to comprehensively verify data obtained through the interaction of components or forces, e.g., the voltage applied to a specific component.

Finally, reports recording the verification results must describe the verification items, verification methods, verification results, and considerations leading to those verification results, and writing such reports is a time-consuming process.

SUMMARY OF THE INVENTION

Therefore, an object of the present invention is to provide an industrial product design verification apparatus whereby omissions in the design verification process are minimal, verification experience is accumulated, and the efficiency of report compilation and other incidental tasks is improved.

To achieve the aforementioned object, a design verification apparatus according to the present invention for verifying the suitability of a new design product by determining whether a product according to the new design satisfies provided specifications, comprises: specification input means for inputting specifications for the new design; old design data storing means for storing old design data; design data generating means for revising said old design data according to the new design specifications, and for generating new design data comprising a list of parts for the new design product and characteristics of the parts to be verified; specification items generating means for generating specification items based on the input specifications, and tolerance ranges for said specification items; knowledge base means for storing verification items based on the old design data, and tolerance ranges for said verification items; verify value calculating means for calculating verify values for the specification items and for the verification items; and evaluation means for comparing the verify values obtained according to said specification items with said tolerance ranges for said specification items, and for comparing the verify values obtained according to said verification items with said tolerance ranges for said verification items, and for evaluating said verify value to be good when said verify value is within the corresponding tolerance range.

According to a preferred embodiment, the old design data storing means stores a plurality of old design data.

According to a preferred embodiment, the design data generating means comprises: selecting means for selecting an old design data which is closest to the new design; and revising means for revising the old design data based on the input specifications, and for generating new design data.

According to a preferred embodiment, the knowledge base means further stores steps for calculating the verify values to be verified for each of the verification items and specification items; and steps for obtaining data required to calculate the verify values.

According to a preferred embodiment, the verify value calculating means comprises a verification list generator for generating a verification list including the verification items and specification items.

According to a preferred embodiment, the verify value calculating means comprises complementary database means for obtaining data required for verify value calculation.

According to a preferred embodiment, the verify value calculating means further comprises an inferring means for obtaining data required for verify value calculation by inferring from other data stored in said complementary database means.

According to a preferred embodiment, the design verification apparatus further comprises a design example registration means for storing said new design data as a design example when said evaluation means evaluates said verify values are good.

According to a preferred embodiment, the design verification apparatus further comprises means for generating a report according to a predetermined format for said new design data.

Also, according to the present invention, a design verification method for verifying the suitability of a new design product by determining whether a product according to the new design satisfies provided specifications, comprises the steps of:

(a) inputting specifications for the new design;

(b) revising an old design data according to the new design specifications;

(c) generating new design data comprising a list of parts for the new design product and characteristics of the parts to be verified;

(d) generating specification items based on the input specifications, and tolerance ranges for said specification items;

(e) reading from a memory verification items based on the old design data, and tolerance ranges for said verification items;

(f) calculating verify values for the specification items and for the verification items; and (g) comparing the verify values obtained according to said specification items with said tolerance ranges for said specification items;

(h) comparing the verify values obtained according to said verification items with said tolerance ranges for said verification items; and (i) evaluating said verify value to be good when said verify value is within the corresponding tolerance range.

By means of the present invention thus described, the content to be verified for each type of product designed is stored in a knowledge base as a list of verification items. Verification errors resulting from failure to verify a particular verification item can therefore be eliminated by executing the verification process to incrementally verify each of the stored verification items.

Verification content is also standardized, and variation in the verification content is eliminated, by using a database storing the values to be verified as the verification content, i.e., storing the steps for calculating the verify values and the steps for obtaining the data required for said calculations, and the inspection rules, e.g., the tolerance ranges for the verify values.

Verification experience and knowledge can also be accumulated, and verification standards can thereby be improved, by also storing in the knowledge base a list of verification items for each product or product category, and the methods or steps for calculating the verify values for each verification and specification item.

By batch managing the specifications data for the components used in the product and other information as a complementary database accessible during verify value calculation, component data can be shared and variation in the calculation of verify values eliminated. By also recording tolerance ranges in the knowledge base and determining whether the verify values are within the tolerance range, verification standards can be standardized and variation in the verification results eliminated.

Adaptive verify value calculation can also be achieved by providing an inference means for inferring data required for verify value calculation from existing data using methods such as artificial intelligence when said required data is not stored in the complementary database.

When actually desiring an industrial product, it is unusual to design all aspects of the product from the beginning. It is more common to draw upon previous designs, and to revise previous designs to satisfy the new specifications. If such previous designs are stored to a design examples database as past design examples, these past designs can be effectively utilized in the design of a new product, and new design data can be more efficiently produced. If design data for which the verification results were verified good are stored to such a design examples database, verified designs can be reused in future designs, and such future designs can be efficiently completed.

By further providing a means for generating reports based on the detailed content of the verification results, the number of steps required for the operator to prepare a verification report decreases. Report management is also facilitated by generating these reports according to a predetermined format.

BRIEF DESCRIPTION OF THE DRAWINGS

The present invention will become more fully understood from the detailed description given below and the accompanying diagrams wherein:

A FIGURE shows a block diagram of the preferred embodiment of a design verification apparatus according to the present invention.

DESCRIPTION OF PREFERRED EMBODIMENT

An embodiment of a design verification apparatus according to the invention is described below with reference to the FIGURE using byway of example only the design of a compressor for an air conditioner.

The design verification apparatus according to the preferred embodiment of the invention is described below with reference to the block diagram shown in the FIGURE. The specifications 6 are the specifications of a new design data, e.g., the compressor that is to be designed, and are input through, for example, a keyboard (not shown). The specification items generator 7 generates calculated specification items 8 from the input specifications 6. More specifically, the specification items generator 7 generates the specification items based on the provided specifications and tolerance ranges for the specification items. The specification items 8 generates a list of specification items that must be verified, and specific values relating to those items, e.g., a range of permissible values.

The design examples database 1 stores old design data, such as a list of parts used, the spatial location of those parts, electrical circuits, appearance, and other information relating to each previously designed compressor. Based on the specifications 6 of the new product to be designed, the design example searcher 2 searches the design examples database 1 to extract as a past design example 3 a previously designed compressor of which the specifications are closest to the specifications 6 or which form the basis of the new product to be designed.

The design reviser 4 revises the past design example 3 located by the design example searcher 2 to meet the specifications 6, and thereby outputs a design data 5. The design data 5 may be newly generated design data or the past design example 3 revised by the design reviser 4 as in this example. It is this design data 5 that must be verified. The design data 5 contains parts for the new design product and characteristics of the parts to be verified. For example, design data 5 includes a list of the components used, the spatial location of those parts, electrical circuits, appearance, and other information relating to the relationships between the parts used.

Relating specifically to the product or product type being designed, a knowledge base 9 formed by a memory stores verification items that must be verified in addition to the specification items, verification steps for those verification items and the specification items 8, tolerance range data, and other information essential to the verification process. A verification list generator 10 generates a list of verification items and specification items that must be verified for each individual parts based on the knowledge base 9 and the specification items 8, and generates a verification list 11 containing for each verification item the method or steps of calculating the verify values 17, the method or steps of obtaining the data required for calculating the verify values 17, and the tolerance range for that verification item.

Note that the verify values as used herein are the values, such as a power factor of the motor, that are evaluated by the verification process to determine whether the design objectives are satisfied based on whether or not the verify values are within the defined tolerance range.

The parts list database 14 stores for the parts used in the designed product data relating to the specifications and provided by the manufacturer. The testing apparatus 12 is used to test the parts used in the product as a means of identifying part characteristics not disclosed by the part manufacturer, and to determine the characteristics of subassemblies made from combinations of parts.

The test data database 13 stores information obtained experimentally by the testing apparatus 12. The inference device 15 inferences from the stored data required data that is not stored in the test data database 13 or the parts list database 14. The test data database 13 and parts list database 14 combined are referred to below as the complementary database.

A verify value calculator 16 obtains the data required to calculate the verify values 17, and then calculates the verify values 17. The data required to calculate the verify values may be obtained by searching the complementary database based on the content of the verification list 11, or by calculating the required data by the inference device 15 when this data is not stored in the complementary database. A verify value evaluator 18 determines whether the verify values 17 calculated for each of the verification items and specification items by the verify value calculator 16 are within the tolerance ranges contained in the verification list 11. It is to be noted that the verify values 17 includes the verify values according to the verification items as obtained from the knowledge base 9 and the verify values according to the specification items as obtained from specification items 8. A verify value 17 is determined to be "verified" ("good") when the verify value 17 is within the corresponding tolerance range.

The design completion evaluator 19 stores or marks the "good" verification items and specification items by the verify value evaluator 18 based on the verification list 11, and determines the design to be completed when a "good" result is returned for all of the verification items and specification items.

The design example register 20 registers the design data 5 for designs determined to be "completed" by the design completion evaluator 19 to the design examples database 1. The report generator 21 generates a report 22 for the design data 5 for which the design completion evaluator 19 determines all verification items to have been verified as "good". When a "good" verified result is not returned for a given verification item, information noting that the verify value was not within the tolerance range is displayed by a FAILURE indicator 23.

The verify value evaluator 18 and design completion evaluator 19 together are referred to as the "evaluator" below.

The operation of a design verification apparatus thus comprised is described below.

First, an operator inputs specifications 6 for a compressor to be newly designed. Then, the design example searcher 2 searches the design examples database 1 to locate from among the examples of previously verified compressor designs a past design example 3 that is closest to the specifications 6 provided for the compressor to be newly designed, or that is suitable as the basis for the new design. The selected past design example 3 is then modified using the design reviser 4 to conform to the new specifications 6, and the design data 5 that must be verified is thus generated by the design reviser 4. The design reviser 4 uses a method whereby part names and other parameters are entered based upon directions displayed on the computer screen.

The specification items generator 7 also generates a list of specification items 8 requiring verification based on the specifications 6. If, for example, the specifications 6 required a motor power factor of 90% or greater, a specification item defining the power factor as the verify value with a tolerance value (range) of 90% or greater is generated.

The knowledge base 9 stores the verification items required to productize the compressor specifications, and the verification method for each of the specification items 8. The verification list generator 10 generates as a list including the specification items 8 required by the specifications 6, and the verification items stored in the knowledge base 9 and requiring confirmation to productize the design. A verification list 11 identifying for each of the verification items and the specification items the steps of calculating the verify value, the steps of obtaining the data required for verify value calculation. Also, the tolerance range for the corresponding verify value is stored in the list 11.

In the case of the compressor in this example, the list of verification items stored to the knowledge base 9 includes a verification item for the motor power factor calculation that is essential to building a feasible compressor based on the specifications. The verification item relating to the motor power factor and stored in the knowledge base 9 identifies the motor power factor as the verify value; identifies the no-load terminal voltage applied to the motor, the internal resistance of the motor, the load during operation, and other parameters as data required for the power factor calculation; identifies the steps for obtaining this data; identifies the steps for calculating the verify value, i.e., the motor power factor; and identifies the tolerance range. When a motor power factor item is then included in the specification items 8, for example, the motor power factor item is added as a verification item to the verification list 11, and the tolerance range for verifying this power factor is the tolerance range defined in the specification item 8.

It is also possible that a particular tolerance range is obtained from an equation including other parameters. If a motor power factor item is not included in the specification items, a motor power factor item will still be included as a verification item in the verification list 11 because a motor power factor item is stored with the "compressor" design type in the knowledge base 9, and the tolerance value in this case will be the tolerance value stored in the knowledge base 9. The steps of calculating the power factor, the steps of obtaining the no-load terminal voltage data required for the power factor calculation, and other related information is also included in the verification list 11 as the verification rules for the motor power factor verification item based on the data stored in the knowledge base 9.

With respect to the verification item for motor power factor calculation, it is assumed below that the verification rule written to the verification list 11 defines the steps of calculating the verify value (the power factor in this case) using a predetermined equation from the no-load terminal voltage, the internal resistance of the motor, and the load during operation; the standard for verifying and accepting the achieved power factor (determining this design parameter to be "good") if the calculated verify value (power factor) is within the defined tolerance range of a reference value; and rules for calculating the no-load terminal voltage from the circuit diagram, obtaining the internal resistance of the motor by searching the parts list database 14, and calculating the load during operation from the data relating to the compressor mechanism driven by the motor and searched from the test data database 13.

The results of previous tests relating to the compressor mechanism are also stored to the test data database 13, and data such as the load on the motor during compression can be obtained by searching the test data database 13.

The verify value calculator 16 determines the data required to calculate the verify value (power factor) based on the content of the verification list 11. Of the required data, the internal resistance of the motor and the operating load can be easily obtained by searching the parts list database 14 and the test data database 13, but the no-load terminal voltage must be computed from the circuit diagram. If it is assumed that, like the motor, the compressor design to be verified also contains parts of which the impedance varies during operation, it is not easy to calculate the no-load terminal voltage from the circuit diagram as specified. In this case, the inference device 15 estimates the range of impedance variation during operation for each of the relevant parts based on the data stored to the test data database 13 and the parts list database 14, estimates the no-load terminal voltage applied to the motor based on the circuit diagrams, and passes this data to the verify value calculator 16.

For example, the test data database 13 may contain the measured values from no-load terminal voltage tests conducted using the same circuitry as that of the air conditioner system design to be verified, but using plural motors of which the internal resistance is different from that of the motor intended for use. The no-load terminal voltage can thus be estimated from the stored data by applying a spline interpolation or other interpolation process, and the estimated no-load terminal voltage is input to the verify value calculator 16. The verify value calculator 16 thus substitutes this data into the power factor equation defined in the verification list 11 to calculate the power factor of the motor.

The verify value evaluator 18 then compares the verify values thus calculated with the tolerance ranges contained in the verification list 11. If the verify value is within the tolerance range, the value is verified "good"; if not within the tolerance range, the value is rejected. If a value is rejected, a notice of rejection and the amount by which the rejected verify value is outside the tolerance range are displayed for the operator by the FAILURE indicator 23.

If verification by the above method is executed to verify only those verification items affected by data changes resulting from further design revisions implemented by the design reviser 4 (design data generator), the operator can incrementally confirm verification results as the design is modified during the design process.

For all of the verification items included in the verification list 11, the design completion evaluator 19 registers the items verified "good" based on the information provided from the verify value evaluator 18, and notifies the operator when all verification and specification items have been verified "good." It is possible to notify the operator when major verification and specification items have been verified "good". When the operator confirms the design based on this verification notice, the report generator 21 generates a report 22 based on the results for the verified design data 5, i.e., the design data 5 of the completed design. The design example register 20 also stores the design data 5 of the completed design as a design example accessible for future design tasks in the design examples database 1.

It is to be noted that the preferred embodiment described above links the design reviser 4 and verification process to enable concurrent verification and design. It will be obvious that it is also possible to generate the design data 5 after completing all required design changes by the design reviser 4, verify all verification and specification items relating to the design data at one time, and then display the rejected verification and specification items and the amount by which the rejected verify value is outside the tolerance range by the FAILURE indicator 23. The operator can then change the design using the design reviser 4 so that the verification and specification items shown as rejected by the FAILURE indicator 23 are accepted and verified. This process of changing and verifying the design data is repeated until all verification and specification items are verified "good" and the design is determined completed by the design completion evaluator 19.

By thus verifying the design data 5, it is possible to obtain the same verification results and eliminate verification omissions irrespective of who executes the actual verification process. In addition, by maintaining a database of past design examples, data from previously verified designs can be reused, and design efficiency improves. In addition, all past verification experiences are stored in the specification items 8, and can therefore be shared to improve the level of the verification contents.

It is also to be noted that while the design verification apparatus according to the preferred embodiment of the invention has been described with respect to a motor used in an air conditioner compressor using the power factor of the motor as an example of the verification items, motor vibration and other parameters of motor performance and operation, including oil requirements, coolant requirements, cylinder volume, and even heat diffusion, would also normally be included in the list of verification items.

It will also be obvious that the design verification apparatus according to the present invention is suitable to products other than air conditioning systems.

Verification omissions are thus eliminated and the level of the verification process (verified content) is improved by the design verification apparatus of the present invention because a knowledge base storing the accumulated experience of past verifications is used. As a result, the number of design revisions required during the product prototyping stage can be reduced, and the overall prototype production cost can be reduced. Designs can also be verified by technicians with less training and experience, and the time required for verification is also reduced.

By using inference techniques, the verification process can also be completed even when all data required for verification is not stored in the databases. Design efficiency is also improved by accumulating the design data for verified designs in a design examples database. The number of steps required to prepare verification reports can also be reduced by providing an automatic report generating capability.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A design verification apparatus for verifying the suitability of a new design product by determining whether a product according to the new design satisfies provided specifications, said design verification apparatus comprising:

specification input means for inputting specifications for the new design;

old design data storing means for storing old design data;

design data generating means for revising said old design data according to the new design specifications, and for generating new design data comprising a list of parts for the new design product and characteristics of the parts to be verified;

specification items generating means for generating specification items based on the input specifications, and tolerance ranges for said specification items;

knowledge base means for storing verification items based on the old design data, and tolerance ranges for said verification items;

verifying value calculating means for calculating verification values for the specification items and for the verification items; and evaluation means for comparing the verification values obtained according to said specification items with said tolerance ranges for said specification items, and for comparing the verification values obtained according to said verification items with said tolerance ranges for said verification items, and for evaluating said verification value to be acceptable when said verification value is within the corresponding tolerance range.

2. A design verification apparatus according to claim 1, wherein said old design data storing means stores a plurality of old design data.

3. A design verification apparatus according to claim 2, wherein said design data generating means comprises:

selecting means for selecting an old design data which is closest to the new design; and revising means for revising the old design data based on the input specifications, and for generating new design data.

4. A design verification apparatus according to claim 1, wherein said knowledge base means further stores an algorithm for calculating the verification values to be verified for each of the verification items and specification items; and stores an algorithm for obtaining data required to calculate the verification values.

5. A design verification apparatus according to claim 4, wherein said verifying value calculating means comprises a verification list generator for generating a verification list including the verification items and specification items.

6. A design verification apparatus according to claim 4, wherein said verifying value calculating means comprises complementary database means for obtaining data required for verification value calculation.

7. A design verification apparatus according to claim 6, wherein said verification value calculating means further comprises an inferring means for obtaining data required for verification value calculation by inferring from other data stored in said complementary database means.

8. A design verification apparatus according to claim 1, further comprising design example registration means for storing said new design data as a design example when said evaluation means evaluates said verification values to be acceptable.

9. A design verification apparatus according to claim 1, further comprising means for generating a report according to a predetermined format for said new design data.

10. A design verification method for verifying the suitability of a new design product by determining whether a product according to the new design satisfies provided specifications, said design verification method comprising:

(a) inputting specifications for the new design;

(b) revising an old design data according to the new design specifications;

(c) generating new design data comprising a list of parts for the new design product and characteristics of the parts to be verified;

(d) generating specification items based on the input specifications, and tolerance ranges for said specification items;

(e) reading, from a memory, verification items based on the old design data; and tolerance ranges for said verification items;

(f) calculating verification values for the specification items and for the verification items; and (g) comparing the verification values obtained according to said specification items with said tolerance ranges for said specification items;

(h) comparing the verification values obtained according to said verification items with said tolerance ranges for said verification items; and (i) evaluating said verification value to be acceptable when said verification value is within the corresponding tolerance range.

* * * * *

UNITED STATES PATENT AND TRADEMARK OFFICE
CERTIFICATE OF CORRECTION

PATENT NO. : 5,687,094
DATED : November 11, 1997
INVENTOR(S) : T. KAGAWA et al.

It is certified that error appears in the above-identified patent and that said Letters Patent is hereby corrected as shown below:

On the cover page of the printed patent, paragraph [75] Inventors, line 2, change "Takatsuki" to ---Osaka Signed and Sealed this Third Day of November, 1998

Attest:

BRUCE LEHMAN

Attesting Officer

Commissioner of Patents and Trademarks